(12) United States Patent
Nam et al.

(10) Patent No.: US 11,538,518 B2
(45) Date of Patent: Dec. 27, 2022

(54) MEMORY DEVICE TO SUSPEND ROM OPERATION AND A METHOD OF OPERATING THE MEMORY DEVICE

(71) Applicant: SK hynix Inc., Icheon-si (KR)

(72) Inventors: Hyeon Su Nam, Icheon-si (KR); Yong Soon Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 26 days.

(21) Appl. No.: 16/815,676

(22) Filed: Mar. 11, 2020

(65) Prior Publication Data

US 2021/0027831 A1 Jan. 28, 2021

(30) Foreign Application Priority Data

Jul. 26, 2019 (KR) .......................... 10-2019-0091191

(51) Int. Cl.
| | |
|---|---|
| *G06F 9/32* | (2018.01) |
| *G11C 11/4093* | (2006.01) |
| *G11C 29/18* | (2006.01) |
| *G06F 9/4401* | (2018.01) |
| *G06F 9/30* | (2018.01) |
| *G11C 7/22* | (2006.01) |
| *G11C 16/16* | (2006.01) |
| *G11C 16/24* | (2006.01) |

(Continued)

(52) U.S. Cl.
CPC .......... *G11C 11/4093* (2013.01); *G06F 9/261* (2013.01); *G06F 9/30101* (2013.01); *G06F 9/32* (2013.01); *G06F 9/4418* (2013.01); *G11C 7/222* (2013.01); *G11C 11/4074* (2013.01); *G11C 16/16* (2013.01); *G11C 16/24* (2013.01); *G11C 17/08* (2013.01); *G11C 29/18* (2013.01)

(58) Field of Classification Search
CPC ........................................................ G06F 9/32
See application file for complete search history.

(56) References Cited

U.S. PATENT DOCUMENTS

2014/0149643 A1* 5/2014 Devinoy ............. G06F 12/0246
711/103
2014/0344502 A1* 11/2014 Hsu ..................... G06F 13/1668
711/102

(Continued)

FOREIGN PATENT DOCUMENTS

| KR | 100613798 B1 | 8/2006 |
|---|---|---|
| KR | 1020120013190 A | 2/2012 |

*Primary Examiner* — Jacob Petranek
(74) *Attorney, Agent, or Firm* — William Park & Associates Ltd.

(57) ABSTRACT

A memory device in accordance with a described method of operation includes a read only memory (ROM) address controller and a suspend signal generator. The ROM address controller is configured to sequentially output a plurality of operation ROM addresses at which ROM codes to be executed in response to an operation command are stored, and to suspend output of the plurality of operation ROM addresses in response to a suspend signal. The suspend signal generator is configured to generate the suspend signal that is activated during a preset period depending on whether a suspend ROM address is identical to an operation ROM address, among the plurality of operation ROM addresses, currently being output. The suspend ROM address is an address at which a ROM code, execution of which is to be suspended, among the ROM codes, is stored.

20 Claims, 9 Drawing Sheets

(51) Int. Cl.
    *G11C 17/08*     (2006.01)
    *G11C 11/4074*     (2006.01)
    *G06F 9/26*     (2006.01)

(56) References Cited

U.S. PATENT DOCUMENTS

| | | | |
|---|---|---|---|
| 2015/0067313 A1* | 3/2015 | Zaidi | G06F 21/572 713/2 |
| 2015/0301935 A1* | 10/2015 | Kato | G06F 9/324 711/103 |
| 2018/0150295 A1* | 5/2018 | Zhang | G06F 9/32 |

* cited by examiner

ROM DATA STORAGE CIRCUIT (410)

| ROM Address | ROM Code |
|---|---|
| 1-100 | Default Operation |
| 101-200 | |
| 201-350 | Read Operation |
| 351-400 | |
| 401-600 | Program Operation |
| 601-700 | |
| 701-900 | Erase operation |
| 901-1000 | |

- 201-350 ← Start ROM Addr 1
- 401-600 ← Start ROM Addr 2
- 701-900 ← Start ROM Addr 3

FIG. 6

MEMORY DEVICE TO SUSPEND ROM OPERATION AND A METHOD OF OPERATING THE MEMORY DEVICE

CROSS-REFERENCE TO RELATED APPLICATION

The present application claims priority under 35 U.S.C. § 119(a) to Korean patent application number 10-2019-0091191 filed on Jul. 26, 2019, in the Korean Intellectual Property Office, the entire disclosure of which is incorporated herein by reference.

BACKGROUND

1. Technical Field

Various embodiments of the present disclosure generally relate to an electronic device, and more particularly, to an electronic memory device and a method of operating the electronic memory device.

2. Related Art

A storage device is a device which stores data under the control of a host device such as a computer or a smartphone. The storage device may include a memory device in which data is stored and a memory controller which controls the memory device. Such memory devices are classified as volatile memory devices or nonvolatile memory devices.

A volatile memory device is a memory device in which data is stored only when power is supplied and in which stored data is lost when the supply of power is interrupted. A nonvolatile memory device is a memory device in which stored data is retained even when the supply of power is interrupted, and examples thereof include a Read Only Memory (ROM), a Programmable ROM (PROM), an Electrically Programmable ROM (EPROM), an Electrically Erasable and Programmable ROM (EEPROM), and a flash memory.

A memory device may store ROM codes indicating an operation algorithm of the memory device in a ROM. The memory device may perform a read operation, a program operation, an erase operation, etc. depending on the algorithm by executing the ROM codes.

SUMMARY

In accordance with an embodiment of the present disclosure is a memory device including a read only memory (ROM) address controller configured to sequentially output a plurality of operation ROM addresses at which ROM codes to be executed in response to an operation command are stored, and to suspend output of the plurality of operation ROM addresses in response to a suspend signal. The memory device also includes a suspend signal generator configured to generate the suspend signal. The suspend signal is activated during a preset period depending on whether a suspend ROM address is identical to an operation ROM address, among the plurality of operation ROM addresses, currently being output. The suspend ROM address is an address at which a ROM code, execution of which is to be suspended, among the ROM codes, is stored.

Also in accordance with an embodiment of the present disclosure is a method of operating a memory device, the memory device storing ROM codes indicating an operation algorithm of the memory device. The method includes sequentially reading a plurality of operation ROM addresses at which ROM codes corresponding to a memory operation, among the ROM codes, are stored. The method further includes determining whether an operation ROM address currently being read, among the plurality of operation ROM addresses, is identical to a suspend ROM address. The method additionally includes suspending, based on a result of the determination, an operation of the memory device being executed based on a ROM code corresponding to the operation ROM address currently being read during a suspend time. The suspend ROM address indicates a ROM address at which a ROM code, execution of which is to be suspended, among ROM codes corresponding to the memory operation, is stored. The suspend time is a time period during which the execution is to be suspended.

BRIEF DESCRIPTION OF THE DRAWINGS

FIG. 6 is a diagram illustrating the ROM data storage circuit of FIG. 4.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to memory devices having improved test performance and a method of operating the memory devices.

Figure 1:
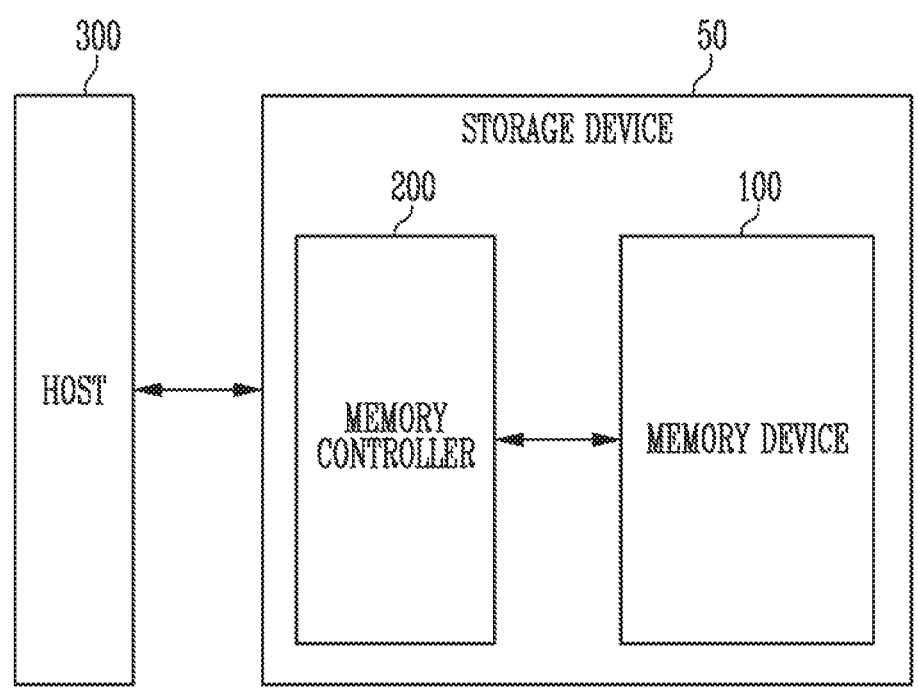
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include at least one memory device 100 and a memory controller 200. The storage device 50 may be a device which stores data under the control of a host 300, such as a mobile phone, a smartphone, an MP3 player, a laptop computer, a desktop computer, a game console, a television (TV), a tablet personal computer (PC), or an in-vehicle infotainment system.

The storage device 50 may be manufactured as any one of various types of storage devices depending on a host interface that is a scheme for communication with the host 300. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

Each of the at least one memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. One memory block may include a plurality of pages. In an embodiment, each page may be a unit by which data is stored in the memory device 100 or by which data stored in the memory device 100 is read.

A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200, and may access the area of the memory cell array, selected by the address. That is, the memory device 100 may perform an operation indicated by the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory controller 200 controls the overall operation of the storage device 50.

When power is applied to the storage device 50, the memory controller 200 may run firmware (FW). When the memory device 100 is a flash memory device, the memory controller 200 may run firmware such as a flash translation layer (FTL) for controlling communication between the host 300 and the memory device 100.

In an embodiment, the memory controller 200 may receive data and a logical block address (LBA) from the host 300, and may translate the logical block address into a physical block address (PBA) indicating the address of memory cells which are included in the memory device 100 and in which data is to be stored.

The memory controller 200 may control the memory device 100 so that a program operation, a read operation, or an erase operation is performed in response to a request received from the host 300. During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a command, an address, and data regardless of a request from the host 300, and may transmit the command, the address, and the data to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control two or more memory devices 100. In such case, the memory controller 200 may control the memory devices 100 depending on an interleaving scheme to improve operating performance. The interleaving scheme may be an operating manner in which the operating periods of the at least two memory devices 100 are caused to overlap each other.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
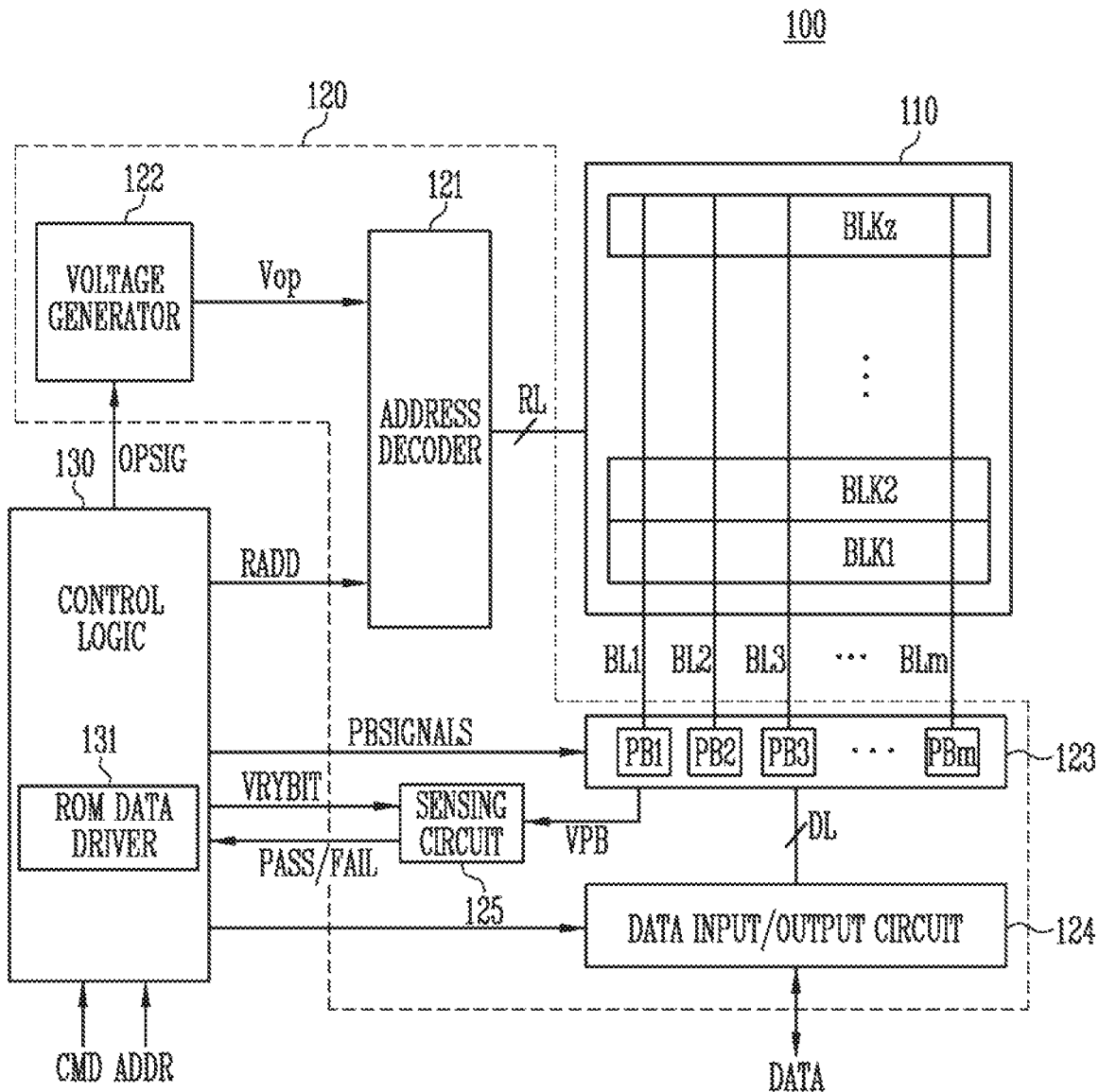
FIG. 2 is a diagram illustrating a structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line, among the plurality of memory cells, are defined as one physical page. In other words, the memory cell array 110 may include a plurality of physical pages. In an embodiment of the present disclosure, each of the memory blocks BLK1 to BLKz included in the memory cell array 110 may include a plurality of dummy cells. For the dummy cells, one or more dummy cells may be coupled in series between a drain select transistor and memory cells and between a source select transistor and memory cells.

Each of the memory cells of the memory device 100 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so as to perform a program operation, a read operation, and an erase operation.

The address decoder 121 is coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment of the present disclosure, the row lines RL may further include a pipe select line.

In an embodiment, the row lines RL may be local lines included in local line groups. Each of the local line groups may correspond to one memory block. The local line group may include a drain select line, local word lines, and a source select line.

The address decoder 121 may be operated under the control of the control logic 130. The address decoder 121 receives addresses ADDR from the control logic 130.

The address decoder 121 may decode a block address, among the received addresses ADDR. The address decoder 121 selects at least one of the memory blocks BLK1 to BLKz according to the decoded block address. The address decoder 121 may decode a row address RADD, among the received addresses ADDR. The address decoder 121 may select at least one word line WL of the selected memory block by applying voltages supplied from the voltage generator 122 to the at least one word line WL according to the decoded row address RADD.

During a program operation, the address decoder 121 may apply a program voltage to the selected word line and apply a pass voltage lower than the program voltage to unselected word lines. During a program verify operation, the address decoder 121 may apply a verify voltage to the selected word line and apply a verify pass voltage higher than the verify voltage to the unselected word lines.

During a read operation, the address decoder 121 may apply a read voltage to the selected word line and apply a read pass voltage higher than the read voltage to the unselected word lines.

In accordance with an embodiment of the present disclosure, an erase operation of the memory device 100 is performed on a memory block basis. During an erase operation, the addresses ADDR input to the memory device 100 include a block address. The address decoder 121 may decode the block address and select one memory block according to the decoded block address. During the erase operation, the address decoder 121 may apply a ground voltage to word lines coupled to the selected memory block.

In accordance with an embodiment of the present disclosure, the address decoder 121 may decode a column address, among the received addresses ADDR. The decoded column address may be transferred to the read and write circuit 123. In an embodiment, the address decoder 121 may include components, such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages used by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/ output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device. The control logic 130 may be implemented as hardware, software, or a combination of hardware and software. For example, the control logic 130 may be a control logic circuit operating in accordance with an algorithm and/or a processor executing control logic code.

The control logic 130 may control the peripheral circuit 120 by generating various types of signals in response to the command CMD and the addresses ADDR. For example, the control logic 130 may generate an operation signal OPSIG, a row address RADD, read and write circuit control signals PBSIGNALS, and the enable bit VRYBIT in response to the command CMD and the addresses ADDR. The control logic 130 may output the operation signal OPSIG to the voltage generator 122, output the row address RADD to the address decoder 121, output the page buffer control signal PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

In an embodiment, the control logic 130 may include a ROM data driver 131.

The ROM data driver 131 may store ROM codes indicating an operation algorithm of the memory device. When a memory operation corresponding to an operation command CMD is performed, the ROM data driver 131 may execute ROM codes corresponding to the memory operation after ROM codes corresponding to a default operation have been executed. The default operation may be an operation of setting the operating environment of the memory device to default values before the memory operation is performed. The memory operation may be any one of a read operation, a program operation, and an erase operation.

For example, the ROM data driver 131 may sequentially read operation ROM addresses at which ROM codes corresponding to the memory operation are stored. The ROM data driver 131 may execute a ROM code corresponding to the read operation ROM addresses. The ROM data driver 131 may control the peripheral circuit 120 so that the memory operation is performed on the memory cell array 110 by executing the ROM codes.

In detail, the ROM data driver 131 may generate the operation signal OPSIG for performing the memory operation and the read and write circuit control signals PBSIGNALS by executing ROM codes. The read and write circuit control signals PBSIGNALS may be page buffer control signals for controlling a voltage that is applied to bit lines which couple page buffers to a memory cell array.

In an embodiment, the ROM data driver 131 may receive a break ROM address at which a ROM code, the execution of which is to be broken off, is stored, through a test command CMD. When a preset break ROM address is identical to an operation ROM address currently being read (or currently being output), the ROM data driver 131 may break off the execution of the ROM code corresponding to the operation ROM address. That is, the ROM data driver 131 may stop a memory operation to be performed based on the ROM code.

When the execution of the ROM code is broken off, the ROM data driver 131 may be reset to normally execute the ROM code again. The ROM data driver 131 may be reset in response to a power-on reset (POR) command. When the ROM data driver 131 is reset, ROM addresses at which ROM codes are stored may be read again from an initial ROM address. The initial ROM address may be a start ROM address of ROM addresses at which the ROM codes corresponding to the default operation are stored.

In an embodiment, the ROM data driver 131 may receive a suspend ROM address at which a ROM code, the execution of which is to be suspended, is stored, and information about a suspend time which is a time period during which the execution is to be suspended, through the test command CMD. When a preset suspend ROM address is identical to an operation ROM address currently being read, the ROM data driver 131 may suspend the execution of the ROM code corresponding to the operation ROM address during a preset period. When the execution of the ROM code is suspended, a memory operation to be performed based on the ROM code may also be suspended during the preset period.

When the preset period has elapsed, the ROM data driver 131 may resume the remaining memory operation from the suspended operation included in the entire memory operation. In detail, the ROM data driver 131 may execute the remaining ROM codes, which are not yet executed, among the ROM codes corresponding to the memory operation. The ROM data driver 131 may sequentially read the remaining operation ROM addresses from an operation ROM address, which is not yet read, among operation ROM addresses. The ROM data driver 131 may execute ROM codes corresponding to the read operation ROM addresses.

Figure 3:
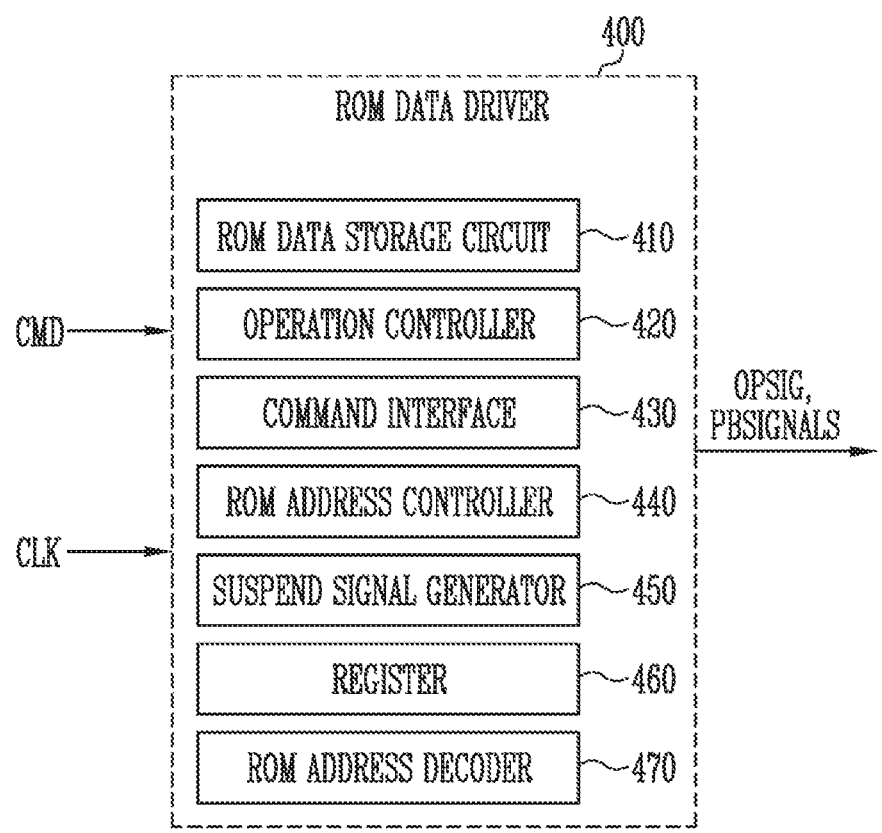
FIG. 3 is a diagram illustrating an embodiment of a ROM data driver of FIG. 2.

FIG. 3 is a diagram illustrating an embodiment of a ROM data driver 400. In an embodiment, the ROM data driver 400 represents the ROM data driver 131 of FIG. 2.

Referring to FIG. 3, the ROM data driver 400 may include a ROM data storage circuit 410, an operation controller 420, a command interface 430, a ROM address controller 440, a suspend signal generator 450, a register 460, and a ROM address decoder 470.

The ROM data storage circuit 410 may store ROM codes indicating an operation algorithm of a memory device. The ROM data storage circuit 410 may be composed of a plurality of register circuits, and the plurality of register circuits may be ROMs.

The operation controller 420 may receive a ROM address to be read from the ROM address controller 440. The operation controller 420 may read the ROM address, and may execute a ROM code corresponding to the ROM address.

The operation controller 420 may generate an operation signal OPSIG for performing a memory operation and read and write circuit control signals PBSIGNALS by executing ROM codes. The read and write circuit control signals PBSIGNALS may include page buffer control signals for controlling a voltage that is applied to bit lines which couple page buffers to a memory cell array.

The command interface 430 may decode commands that are input to the memory device. The command interface 430 may decode an operation command, and may provide a start ROM address which is a first operation ROM address, among consecutive operation ROM addresses corresponding to the memory operation, to the ROM address controller 440 depending on the result of decoding.

In various embodiments, the command interface 430 may be disposed outside the ROM data driver 400.

The ROM address controller 440 may provide ROM addresses at which ROM codes to be executed are stored to the operation controller 420. In detail, the ROM address controller 440 may sequentially provide the operation ROM addresses, at which ROM codes corresponding to the memory operation are stored, to the operation controller 420 and the suspend signal generator 450.

When a suspend signal provided by the suspend signal generator 450 is received, the ROM address controller 440 may suspend the output of operation ROM addresses (ROM Addr). When the level of the received suspend signal makes a transition from an active level to an inactive level, the ROM address controller 440 may resume the output of the operation ROM addresses.

The suspend signal generator 450 may provide a suspend signal having any one of an active level and an inactive level to the ROM address controller 440. The suspend signal generator 450 may generate the suspend signal depending on whether an operation ROM address currently being read is identical to a preset ROM address. The suspend signal generator 450 may provide the suspend signal having an active level to the ROM address controller 440 during a preset period.

The suspend signal generator 450 may acquire the preset ROM address from the ROM address decoder 470. The suspend signal generator 450 may acquire a time code indicating the preset period from the register 460.

The register 460 may store code values indicating operating conditions of the memory device. The register 460 may set code values in response to a test command. The register 460 may receive and store the time code and a ROM address code through the test command.

In various embodiments, the register 460 may be disposed outside the ROM data driver 400.

The ROM address decoder 470 may provide the ROM address to the suspend signal generator 450 by decoding the ROM address code stored in the register 460.

Figure 4:
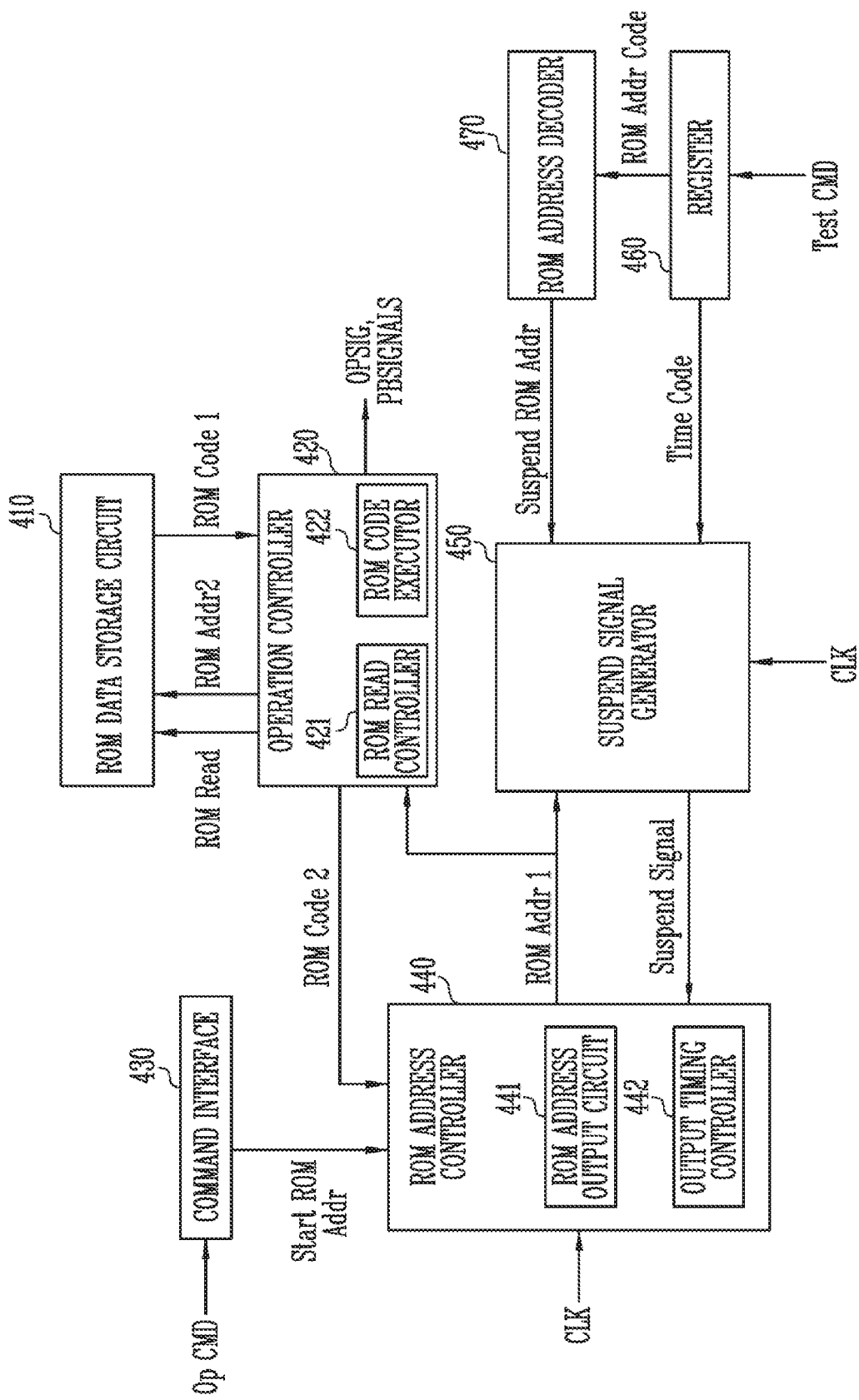
FIG. 4 is a diagram illustrating a configuration and operation of the ROM data driver of FIG. 3.

FIG. 4 is a diagram illustrating the configuration and operation of the ROM data driver 400 of FIG. 3.

Referring to FIG. 4, the ROM data driver 400 may include a ROM data storage circuit 410, an operation controller 420, a command interface 430, a ROM address controller 440, a suspend signal generator 450, a register 460, and a ROM address decoder 470.

The ROM data storage circuit 410 may store ROM codes indicating an operation algorithm of a memory device. For example, the ROM data storage circuit 410 may store ROM codes corresponding to a default operation. The default operation may be an operation of setting the operating environment of the memory device to default values before the memory operation is performed. The memory operation may be any one of a read operation, a program operation, and an erase operation. The ROM data storage circuit 410 may store ROM codes corresponding to the memory operation.

The ROM data storage circuit 410 may be composed of a plurality of register circuits, and the plurality of register circuits may be ROMs.

The operation controller 420 may include a ROM read controller 421 and a ROM code executor 422.

The ROM read controller 421 may receive a ROM address (ROM Addr 1) to be read from the ROM address controller 440. The ROM read controller 421 may acquire a ROM code (ROM Code 1) corresponding to a ROM address (ROM Addr 2) from the ROM data storage circuit 410 based on a ROM read command (ROM Read). The ROM read controller 421 may provide the acquired ROM code (ROM Code 2) to the ROM address controller 440.

The ROM code executor 422 may execute the ROM code acquired from the ROM data storage circuit 410. The operation controller 420 may generate an operation signal OPSIG for performing the memory operation and read and write circuit control signals PBSIGNALS by executing the ROM codes. The read and write circuit control signals PBSIGNALS may be page buffer control signals for controlling a voltage that is applied to bit lines which couple page buffers to a memory cell array.

The command interface 430 may decode commands CMD that are input to the memory device. The command interface 430 may decode an operation command Op CMD, and may provide the ROM address controller 440 with a start ROM address (Start ROM Addr), among operation ROM addresses, based on the result of decoding. The operation ROM addresses may be consecutive ROM addresses at which ROM codes corresponding to a memory operation to be performed in response to the operation command Op CMD are stored.

The ROM address controller 440 may provide the operation ROM addresses (e.g., ROM Addr 1) at which ROM codes to be executed are stored to the operation controller 420. When a suspend signal having an inactive level is received, the ROM address controller 440 may output the operation ROM addresses to the operation controller 420 in synchronization with an internal clock CLK. When a suspend signal having an active level is received, the ROM address controller 440 may suspend the output of the operation ROM addresses. When the level of the received suspend signal makes a transition from an active level to an inactive level, the ROM address controller 440 may resume the output of the operation ROM addresses. In an embodiment, the active level may be a logical high level, and the inactive level may be a logical low level. Alternatively, the active level may be a logical low level, and the inactive level may be a logical high level.

In an embodiment, the ROM address controller 440 may include a ROM address output circuit 441 and an output timing controller 442.

The ROM address output circuit 441 may output the operation ROM addresses to the operation controller 420 in response to a ROM address output signal received from the output timing controller 442.

In detail, the ROM address output circuit 441 may provide the operation ROM addresses, at which ROM codes corresponding to the memory operation are stored, to the operation controller 420 and the suspend signal generator 450. The ROM address output circuit 441 may provide the start ROM address (Start ROM Addr) provided from the command interface 430 to the operation controller 420. The start ROM address may be a first operation ROM address, among consecutive operation ROM addresses corresponding to the memory operation matching the operation command Op CMD.

Each ROM code may include information about a ROM address to be subsequently read. Therefore, the ROM address output circuit 441 may provide a second ROM address, among the consecutive operation ROM addresses, to the operation controller 420 based on the ROM code corresponding to the start ROM address provided from the operation controller 420. In this way, the ROM address output circuit 441 may sequentially output the operation ROM addresses to the operation controller 420.

The output timing controller 442 may provide the ROM address output signal to the ROM address output circuit 441 based on the internal clock CLK and the suspend signal.

In detail, the output timing controller 442 may provide the ROM address output signal to the ROM address output circuit 441 in synchronization with the internal clock CLK when the level of the suspend signal is an inactive level. The output timing controller 442 might not provide the ROM address output signal to the ROM address output circuit 441 in synchronization with the internal clock CLK when the level of the suspend signal is an active level.

The suspend signal generator 450 may provide the suspend signal having any one of an active level and an inactive level to the ROM address controller 440 in synchronization with the internal clock.

In an embodiment, the suspend signal generator 450 may receive a break ROM address at which a ROM code, the execution of which is to be broken off, is stored from the ROM address decoder 470. The suspend signal generator 450 may determine whether the break ROM address is identical to an operation ROM address currently being read.

When it is determined that the break ROM address is different from the operation ROM address, the suspend signal generator 450 may provide a suspend signal having an inactive level to the ROM address controller 440. When it is determined that the break ROM address is identical to the operation ROM address, the suspend signal generator 450 may provide a suspend signal having an active level to the ROM address controller 440.

The suspend signal generator 450 may continuously provide a suspend signal having an active level to the ROM address controller 440 until the suspend signal generator 450 is reset in response to an initialization command. The initialization command may include a power-on reset (POR) command.

In an embodiment, the suspend signal generator 450 may receive a suspend ROM address (Suspend ROM Addr) at which a ROM code, the execution of which is to be suspended, is stored from the ROM address decoder 470. The suspend signal generator 450 may receive a time code indicating a suspend time, which is a time period during which the execution of the ROM code is to be suspended, from the register 460.

The suspend signal generator 450 may determine whether the suspend ROM address is identical to an operation ROM address currently being read.

When it is determined that the suspend ROM address is different from the operation ROM address, the suspend signal generator 450 may provide a suspend signal having an inactive level to the ROM address controller 440. When it is determined that the suspend ROM address is identical to the operation ROM address, the suspend signal generator 450 may provide a suspend signal having an active level to the ROM address controller 440 during the suspend time. When the suspend time has elapsed, the suspend signal generator 450 may provide a suspend signal having an inactive level to the ROM address controller 440.

The register 460 may store code values indicating operating conditions of the memory device. The register 460 may set code values in response to a test command. The test command may include at least one of a set parameter command and a set feature command.

In an embodiment, the register 460 may receive a time code and a ROM address code (ROM Addr Code) through the test command (Test CMD), and may store the received codes.

The time code stored in the register 460 may be provided to the suspend signal generator 450. The ROM address code stored in the register 460 may be decoded by the ROM address decoder 470, and may then be provided to the suspend signal generator 450.

In an embodiment, the register 460 may store a ROM address code indicating a break ROM address (not illustrated) in response to the test command. In an embodiment, the register 460 may store a time code indicating the suspend time and a ROM address code indicating a suspend ROM address in response to the test command.

The ROM address decoder 470 may generate a ROM address by decoding the ROM address code stored in the register 460. The ROM address decoder 470 may provide the suspend ROM address to the suspend signal generator 450 by decoding the ROM address code.

Figure 5:
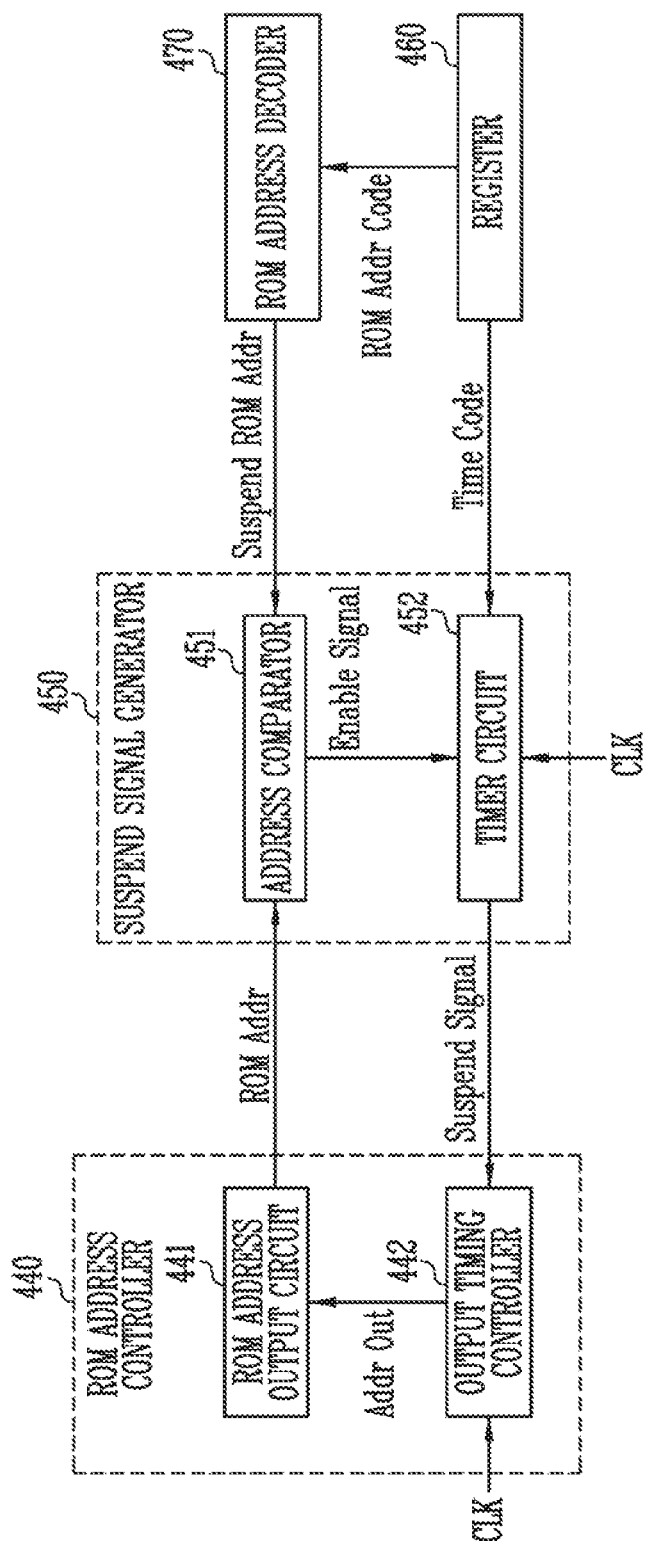
FIG. 5 is a diagram illustrating a configuration and operation of a suspend signal generator of FIG. 4.

FIG. 5 is a diagram illustrating the configuration and operation of the suspend signal generator 450 of FIG. 4.

Referring to FIG. 5, the ROM address controller 440 may include a ROM address output circuit 441 and an output timing controller 442.

The ROM address output circuit 441 may output an operation ROM address (ROM Addr) to an address comparator 451 in response to a ROM address output signal (Addr Out) received from the output timing controller 442.

The output timing controller 442 may provide the ROM address output signal (Addr Out) to the ROM address output circuit 441 based on an internal clock CLK and a suspend signal.

In detail, the output timing controller 442 may provide the ROM address output signal (Addr Out) to the ROM address output circuit 441 in synchronization with the internal clock CLK when the level of the suspend signal is an inactive level. The output timing controller 442 might not provide the ROM address output signal (Addr Out) to the ROM address output circuit 441 in synchronization with the internal clock CLK when the level of the suspend signal is an active level.

The suspend signal generator 450 may include the address comparator 451 and a timer circuit 452.

The address comparator 451 may receive an operation ROM address from the ROM address controller 440.

In an embodiment, the address comparator 451 may receive a suspend ROM address (Suspend ROM Addr) from the ROM address decoder 470. The suspend ROM address may be a ROM address at which a ROM code, the execution of which is to be suspended, is stored, among operation ROM addresses at which ROM codes corresponding to a memory operation are stored.

The address comparator 451 may determine whether the operation ROM address (ROM Addr) is identical to the suspend ROM address by comparing the addresses with each other. The address comparator 451 may generate an enable signal depending on the result of the comparison, and may then output the enable signal to the timer circuit 452.

For example, the address comparator 451 may generate an enable signal having an active level when the operation ROM address is identical to the suspend ROM address. The address comparator 451 may generate an enable signal having an inactive level when the operation ROM address is different from the suspend ROM address.

In an embodiment, the active level may be a logical high level, and the inactive level may be a logical low level. Alternatively, the active level may be a logical low level, and the inactive level may be a logical high level.

The timer circuit 452 may generate a suspend signal in response to the enable signal.

In an embodiment, the timer circuit 452 may generate the suspend signal having an inactive level in response to the enable signal having an inactive level. The timer circuit 452 may generate the suspend signal having an active level in response to the enable signal having an active level.

The timer circuit 452 may output the generated suspend signal to the ROM address controller 440. The timer circuit 452 may receive a time code indicating a suspend time from the register 460. The suspend time may be a time period during which the execution of the ROM code corresponding to the suspend ROM address is to be suspended.

The timer circuit 452 may output the suspend signal having an active level to the ROM address controller 440 during the suspend time.

In detail, the timer circuit 452 may be operated in synchronization with the internal clock CLK, and may count a preset number of clocks based on the time code indicating the suspend time. The timer circuit 452 may output the suspend signal having an active level to the output timing controller 442 of the ROM address controller 440 until a preset number of clocks are counted.

In an embodiment, the address comparator 451 may receive a break ROM address (not illustrated) from the ROM address decoder 470. The address comparator 451 may generate an enable signal having an active level when the operation ROM address is identical to the break ROM address. The break ROM address may be a ROM address at which a ROM code, the execution of which is to be broken off, is stored, among operation ROM addresses at which ROM codes corresponding to a memory operation are stored.

The timer circuit 452 may receive a time code corresponding to the break ROM address from the register 460. In this case, the timer circuit 452 may continuously output the suspend signal having an active level to the output timing controller 442 of the ROM address controller 440 until the timer circuit 452 is reset in response to an initialization command.

FIG. 6 is a diagram illustrating the ROM data storage circuit 410 of FIG. 4.

Referring to FIG. 6, the ROM data storage circuit 410 may store ROM codes indicating an operation algorithm of a memory device. ROM addresses may be physical addresses at which the ROM codes are stored in the ROM data storage circuit 410.

In FIG. 6, a description will be made on the assumption of a ROM addresses range from 1 to 1000. The ROM data storage circuit 410 may store ROM codes respectively corresponding to ROM addresses from 1 to 1000. The number of ROM codes stored in the ROM data storage circuit 410 and the algorithm types of the memory device indicated by the ROM codes are not limited to the present embodiment.

In an embodiment, the ROM data storage circuit 410 may store ROM codes corresponding to a default operation and ROM codes corresponding to a memory operation. The default operation may be an operation of setting up operating conditions of the memory device to preset default values. The memory operation may be any one of a read operation, a program operation, and an erase operation.

Among the ROM codes stored in the ROM data storage circuit 410, the ROM codes corresponding to the ROM addresses from 1 to 100 may be ROM codes corresponding to the default operation. Among the ROM codes stored in the ROM data storage circuit 410, the ROM codes corresponding to the ROM addresses from 201 to 350 may be ROM codes corresponding to a read operation. Among the ROM codes stored in the ROM data storage circuit 410, the ROM codes corresponding to the ROM addresses from 401 to 600 may be ROM codes corresponding to a program operation. Among the ROM codes stored in the ROM data storage circuit 410, the ROM codes corresponding to the ROM addresses from 701 to 900 may be ROM codes corresponding to an erase operation. The location at which each operation algorithm of the memory device is stored is not limited to the present embodiment.

When the memory device is reset in response to an initialization command, ROM codes starting from a ROM code corresponding to an initial ROM address may be read. The initialization command may include a power-on reset (POR) command. The initial ROM address may be '1' which is a first ROM address, among the ROM addresses of the ROM data storage circuit 410.

In an embodiment, the memory operation may be performed after the default operation has been performed. Therefore, in the case of a read operation, after the ROM codes corresponding to the default operation have been executed, the ROM codes corresponding to the read operation may be executed. In the case of a program operation, after the ROM codes corresponding to the default operation have been executed, the ROM codes corresponding to the program operation may be executed. In the case of an erase operation, after the ROM codes corresponding to the default operation have been executed, the ROM codes corresponding to the erase operation may be executed.

After the default operation, which one of the read operation, the program operation, and the erase operation is to be performed may be determined depending on the operation command. A first ROM address, among operation ROM addresses at which ROM codes corresponding to respective operations are stored, may be a start ROM address.

For example, the start ROM address corresponding to the read operation, that is, Start ROM Addr 1, may be 201. The start ROM address corresponding to the program operation, that is, Start ROM Addr 2, may be 401. The start ROM address corresponding to the erase operation, that is, Start ROM Addr 3, may be 701.

When respective operations are performed, ROM codes corresponding to the respective operations may be sequentially executed.

For example, when the default operation is performed, ROM address 1 may be read, and a ROM code corresponding to the ROM address 1 may be executed. Thereafter, ROM address 2 may be read, and a ROM code corresponding to the ROM address 2 may be executed. In this way, the ROM addresses from 1 to 100 may be sequentially read, and ROM codes corresponding to the read ROM addresses may be sequentially executed.

When the read operation is performed, ROM codes corresponding to read ROM addresses may be sequentially executed while ROM addresses from 201 to 350 are sequentially read, as described above. When the program operation is performed, ROM codes corresponding to read ROM addresses may be sequentially executed while ROM addresses from 401 to 600 are sequentially read. When the erase operation is performed, ROM codes corresponding to read ROM addresses may be sequentially executed while ROM addresses from 701 to 900 are sequentially read.

In other words, when the read command is input, the ROM codes corresponding to ROM addresses from 1 to 100 may be executed, after which the ROM codes corresponding to ROM addresses from 201 to 350 may be executed. When the program command is input, the ROM codes corresponding to ROM addresses from 1 to 100 may be executed, after which the ROM codes corresponding to ROM addresses from 401 to 600 may be executed. When the erase command is input, the ROM codes corresponding to ROM addresses from 1 to 100 may be executed, after which the ROM codes corresponding to ROM addresses from 701 to 900 may be executed.

Figure 7:
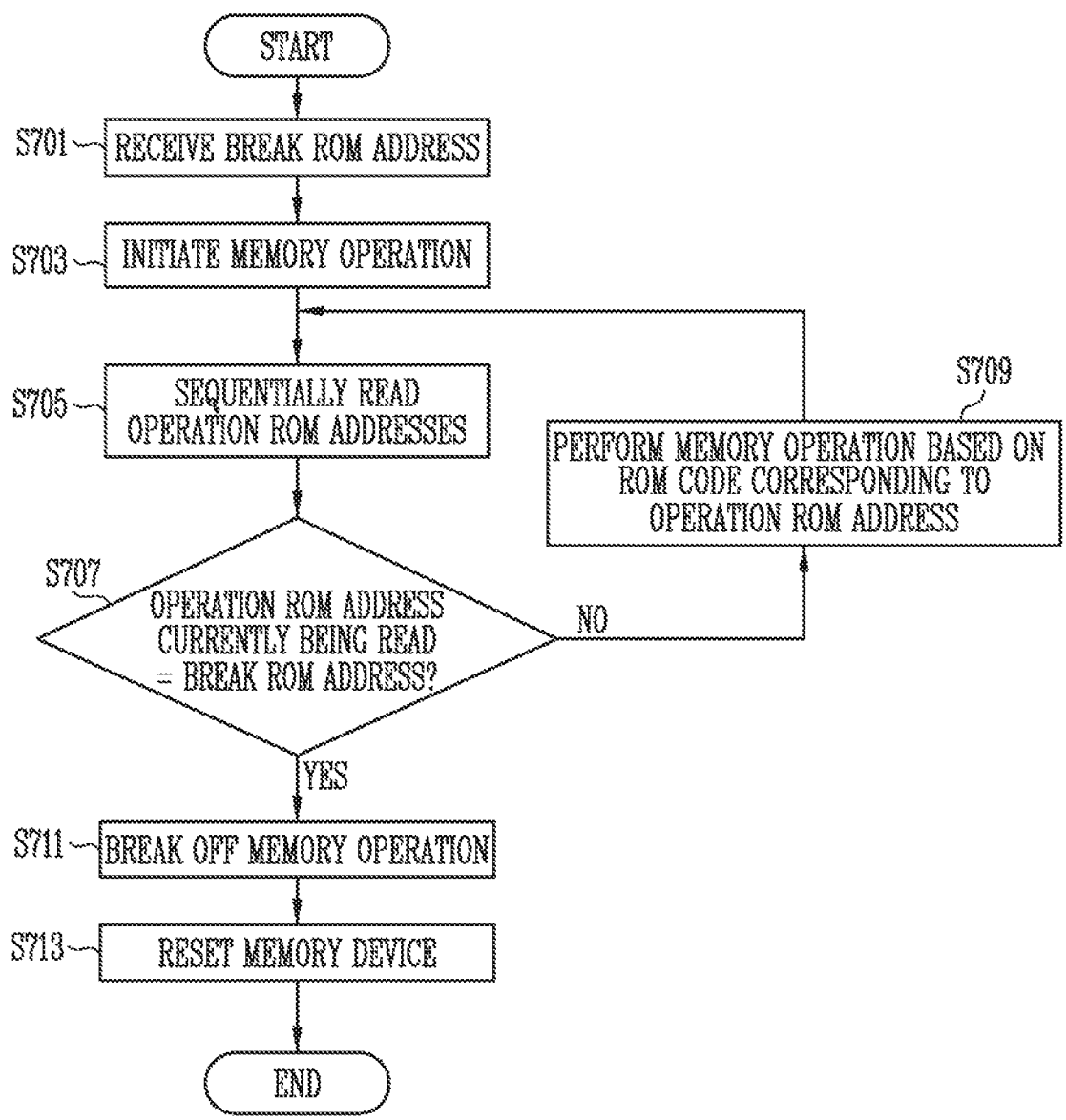
FIG. 7 is a flowchart illustrating the operation of a memory device according to an embodiment.

FIG. 7 is a flowchart illustrating the operation of a memory device according to an embodiment.

Referring to FIG. 7, at step S701, the memory device may receive a break ROM address from a memory controller through a test command. The break ROM address may be a ROM address at which a ROM code, the execution of which is to be broken off, among ROM codes corresponding to a memory operation, is stored.

At step S703, the memory device may initiate the memory operation corresponding to an operation command. The memory operation may be any one of a read operation, a program operation, and an erase operation.

At step S705, the memory device may sequentially read operation ROM addresses at which ROM codes corresponding to the memory operation are stored.

At step S707, the memory device may determine whether an operation ROM address currently being read is identical to a preset break ROM address. When it is determined that the operation ROM address is identical to the break ROM address, the memory device may proceed to step S711. When it is determined that the operation ROM address is different from the break ROM address, the memory device may proceed to step S709. Step S707 may be performed whenever the memory device reads the operation ROM address at step S705.

At step S709, the memory device may perform the memory operation based on the ROM code corresponding to the operation ROM address.

At step S711, the memory device may break off the memory operation to be performed based on the ROM code corresponding to the operation ROM address.

At step S713, the memory device may be reset in response to a reset command received from the memory controller so as to initialize the memory operation that is broken off.

Figure 8:
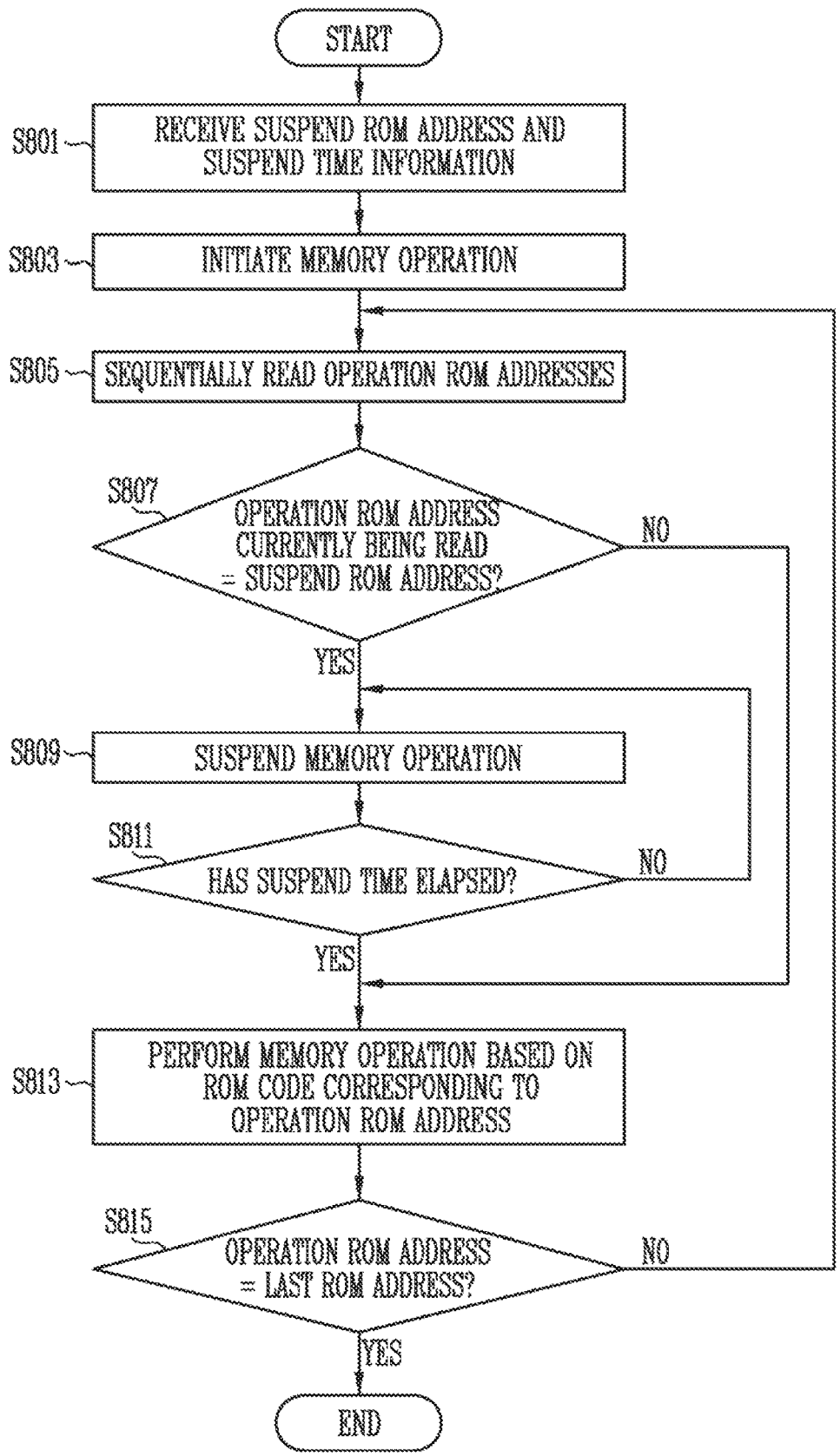
FIG. 8 is a flowchart illustrating the operation of a memory device according to an embodiment.

FIG. 8 is a flowchart illustrating the operation of a memory device according to an embodiment.

Referring to FIG. 8, at step S801, the memory device may receive a suspend ROM address and information about a suspend time from the memory controller through a test command. The suspend ROM address may be a ROM address at which a ROM code, the execution of which is to be suspended, among ROM codes corresponding to a memory operation, is stored. The suspend time may be a time period during which the execution is to be suspended.

At step S803, the memory device may initiate the memory operation corresponding to an operation command. The memory operation may be any one of a read operation, a program operation, and an erase operation.

At step S805, the memory device may sequentially read operation ROM addresses at which ROM codes corresponding to the memory operation are stored.

At step S807, the memory device may determine whether an operation ROM address currently being read is identical to a preset suspend ROM address. When it is determined that the operation ROM address is identical to the suspend ROM address, the memory device may proceed to step S809. When it is determined that the operation ROM address is different from the suspend ROM address, the memory device may proceed to step S813. Step S807 may be performed whenever the memory device reads the operation ROM address at step S805.

At step S809, the memory device may suspend the memory operation to be performed based on the ROM code corresponding to the operation ROM address.

At step S811, the memory device may determine whether the suspend time has elapsed since the suspension of the memory operation. When it is determined that the suspend time has elapsed, the memory device may proceed to step S813, otherwise the memory device may return to step S809.

At step S813, the memory device may perform the memory operation based on the ROM code corresponding to the operation ROM address.

At step S815, the memory device may determine whether the read operation ROM address is a last ROM address, among operation ROM addresses corresponding to the memory operation. When it is determined that the operation ROM address is the last ROM address, the memory device terminates the operation, otherwise the memory device returns to step S805.

Unlike the embodiment of FIG. 7, the embodiment of FIG. 8 may suspend the operation of the memory device only during a preset time and then resume the corresponding operation, without having to reset the operation of the memory device after the operation of the memory device is broken off so as to test the memory device, thus reducing the time required for testing the memory device, with the result that test performance may be improved.

Figure 9:
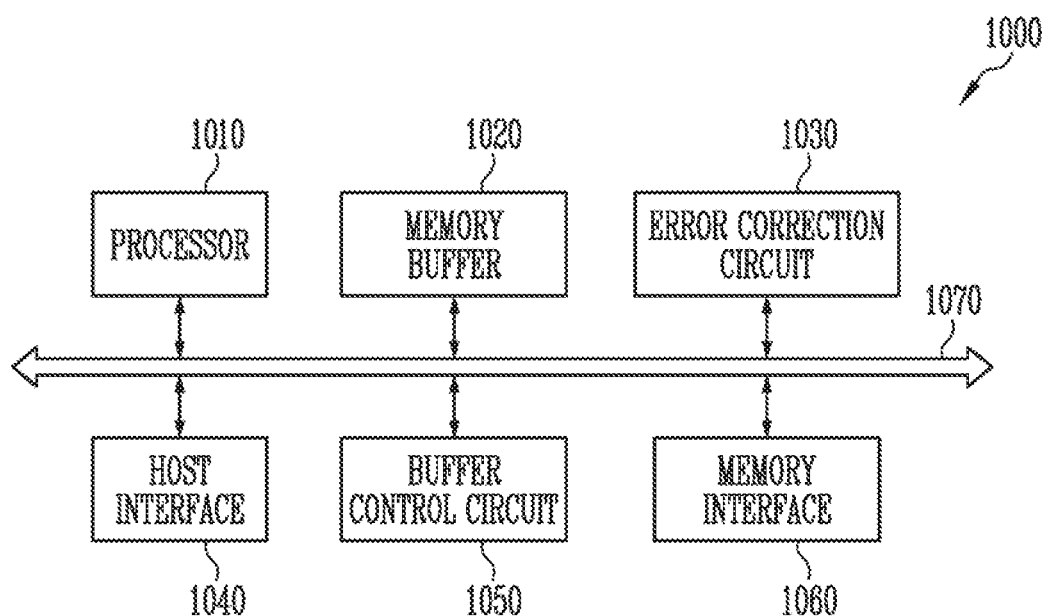
FIG. 9 is a diagram illustrating an embodiment of a memory controller of FIG. 1.

FIG. 9 is a diagram illustrating an embodiment of a memory controller 1000. For an embodiment, the memory controller 1000 represents the memory controller 200 of FIG. 1.

Referring to FIG. 9, the memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

The memory controller 1000 may include a processor 1010, a memory buffer 1020, an error correction circuit (error correction code: ECC circuit) 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The error correction circuit 1030 may perform error correction. The error correction circuit 1030 may perform error correction code (ECC) encoding based on data to be written to the memory device through the memory interface 1060. The ECC-encoded data may be transferred to the memory device through the memory interface 1060. The error correction circuit 1030 may perform ECC decoding based on data received from the memory device through the memory interface 1060. In an example, the error correction circuit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the error correction circuit 1030, and the memory interface 1060. The control bus may be coupled to the host interface 1040, the processor 1010, the buffer control circuit 1050, the memory buffer 1020, and the memory interface 1060.

In accordance with the present disclosure, a memory device having improved test performance and a method of operating the memory device have been described in detail.

What is claimed is:

1. A memory device, comprising:
   a read only memory (ROM) address controller configured to sequentially output a plurality of operation ROM addresses at which original ROM codes to be executed in response to an operation command are stored, and configured to suspend output of the plurality of operation ROM addresses in response to a suspend signal;
   a suspend signal generator configured to generate the suspend signal; and
   a register configured to, in response to an external command, store a time code indicating a preset period and store a ROM address code indicating a suspend ROM address,
   wherein the suspend signal is activated during the preset period, depending on whether the suspend ROM address is identical to an operation ROM address, among the plurality of operation ROM addresses, currently being output, and
   wherein the suspend ROM address is an address of a ROM code selected from among the original ROM codes according to whether execution is suspended.

2. The memory device according to claim 1, further comprising:
   a ROM address decoder configured to provide the suspend ROM address obtained by decoding the ROM address code to the suspend signal generator.

3. The memory device according to claim 2, wherein:
   the register is configured to store code values indicating operating conditions of the memory device, and
   the external command includes at least one of a set parameter command and a set feature command for setting code values stored in the register.

4. The memory device according to claim 2, further comprising:
   a ROM data storage circuit configured to store the original ROM codes indicating an operation algorithm of the memory device;
   a command interface configured to decode the operation command, and then to provide a start ROM address, among the plurality of operation ROM addresses, to the ROM address controller; and
   an operation controller configured to acquire, from the ROM data storage circuit, a ROM code corresponding to the operation ROM address currently being output and provide the ROM code to the ROM address controller.

5. The memory device according to claim 4, wherein the ROM address controller is configured to determine an operation ROM address to be output next to the operation ROM address currently being output, among the plurality of operation ROM addresses, based on the ROM code corresponding to the operation ROM addresses.

6. The memory device according to claim 1, wherein the ROM address controller is configured to output the plurality of operation ROM addresses in synchronization with an internal clock.

7. The memory device according to claim 1, wherein the ROM address controller is configured to:
suspend output of the plurality of operation ROM addresses in response to the suspend signal having an active level, and
resume the output of the plurality of operation ROM addresses when a level of the suspend signal makes a transition from the active level to an inactive level.

8. The memory device according to claim 1, wherein the suspend signal generator comprises:
an address comparator configured to, depending on whether the suspend ROM address is identical to the operation ROM address currently being output, output an enable signal having any one of an active level and an inactive level; and
a timer circuit configured to output the suspend signal having any one of an active level and an inactive level in response to the enable signal.

9. The memory device according to claim 8, wherein the address comparator is configured to, when the suspend ROM address is identical to the operation ROM address, output the enable signal having an active level.

10. The memory device according to claim 9, wherein the timer circuit is configured to output the suspend signal having an active level during the preset period in response to the enable signal having an active level.

11. The memory device according to claim 10, wherein the timer circuit is configured to operate in synchronization with an internal clock and is configured to count a preset number of clocks based on the time code indicating the preset period and then to output the suspend signal during the preset period.

12. The memory device according to claim 8, wherein the address comparator is configured to, when the suspend ROM address is different from the operation ROM address currently being output, output the enable signal having an inactive level.

13. The memory device according to claim 12, wherein the timer circuit is configured to output the suspend signal having an inactive level in response to the enable signal having an inactive level.

14. The memory device according to claim 4, wherein the operation controller is further configured to generate an operation signal and page buffer control signals based on ROM codes corresponding to the plurality of operation ROM addresses, wherein the operation signal is a signal for performing a memory operation corresponding to the operation command.

15. The memory device according to claim 14, further comprising:
a plurality of memory blocks;
a voltage generator configured to generate operating voltages for an operation of the memory device in response to the operation signal;
a read and write circuit configured to include page buffers coupled to the plurality of memory blocks through bit lines and to control voltages that are applied to the bit lines in response to the page buffer control signals;
an address decoder configured to transfer the operating voltages to a memory block selected from among the plurality of memory blocks based on an address; and
an input/output circuit configured to exchange the operation command, the address, and the data with a memory controller.

16. The memory device according to claim 14, wherein the memory operation comprises at least one of a read operation, a program operation, and an erase operation.

17. A method of operating a memory device, the memory device storing original ROM codes indicating an operation algorithm of the memory device, the method comprising:
receiving a suspend time through an external command;
sequentially reading a plurality of operation ROM addresses at which ROM codes corresponding to a memory operation, among the original ROM codes, are stored;
determining whether an operation ROM address currently being read, among the plurality of operation ROM addresses, is identical to a suspend ROM address; and
suspending, based on a result of the determination, an operation of the memory device being executed based on a ROM code corresponding to the operation ROM address currently being read during the suspend time,
wherein the suspend ROM address is an address of a ROM code selected from among the original ROM codes according to whether execution is suspended.

18. The method according to claim 17, further comprising:
resuming, when the suspend time has elapsed, a remaining memory operation starting from a suspended operation in the memory operation.

19. The method according to claim 18, wherein resuming the remaining memory operation comprises:
sequentially reading remaining operation ROM addresses starting from the operation ROM address currently being read, among the plurality of operation ROM addresses; and
performing an operation of the memory device based on ROM codes corresponding to the remaining operation ROM addresses.

20. The method according to claim 17, further comprising:
receiving the suspend ROM address through the external command.

* * * * *